United States Patent
Akiyoshi (10) Patent No.: US 6,967,163 B2
(45) Date of Patent: Nov. 22, 2005

(54) METAL FILM AND MANUFACTURING METHOD THEREFOR, AND LAMINATED CERAMIC ELECTRONIC COMPONENT AND MANUFACTURING METHOD THEREFOR

(75) Inventor: Teppei Akiyoshi, Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/164,564

(22) Filed: Jun. 10, 2002

(65) Prior Publication Data

US 2003/0022492 A1 Jan. 30, 2003

(30) Foreign Application Priority Data

Jun. 8, 2001 (JP) ........................................ 2001-174251
Apr. 2, 2002 (JP) ........................................ 2002-099749

(51) Int. Cl.[7] .............................................. H01L 21/44
(52) U.S. Cl. ...................................... 438/678; 438/680
(58) Field of Search ................................ 438/678, 118, 438/FOR 390, 680

(56) References Cited

U.S. PATENT DOCUMENTS

| | | | |
|---|---|---|---|
| 3,877,981 A | | 4/1975 | Arnold |
| 4,354,911 A | | 10/1982 | Dodd et al. |
| 5,046,236 A | | 9/1991 | Wada et al. |
| 5,055,280 A | * | 10/1991 | Nakatani et al. ............. 423/276 |
| 5,576,053 A | | 11/1996 | Senda et al. |
| 5,595,943 A | * | 1/1997 | Itabashi et al. ................ 427/98 |
| 6,207,550 B1 | * | 3/2001 | Hase et al. .................. 438/613 |
| 6,211,071 B1 | * | 4/2001 | Lukanc et al. .............. 438/640 |
| 6,265,075 B1 | * | 7/2001 | Klueppel et al. ............ 428/418 |
| 6,406,743 B1 | * | 6/2002 | Lee et al. ....................... 427/98 |
| 6,426,293 B1 | * | 7/2002 | Wang et al. ................. 438/687 |
| 6,436,816 B1 | * | 8/2002 | Lee et al. .................... 438/643 |
| 6,465,354 B1 | * | 10/2002 | Sugai et al. ................. 438/692 |
| 2001/0010403 A1 | * | 8/2001 | Farrar ......................... 257/762 |

FOREIGN PATENT DOCUMENTS

| | | |
|---|---|---|
| EP | 0 381 879 | 2/1989 |
| EP | 0 485 176 | 11/1991 |
| JP | 1-226139 | 9/1989 |
| JP | 4-314876 | 11/1992 |
| JP | 6-302469 | 10/1994 |
| JP | 7-57961 | 3/1995 |
| JP | 7-66072 | 3/1995 |
| JP | 10-340629 | 12/1998 |

* cited by examiner

Primary Examiner—George Fourson
Assistant Examiner—Michelle Estrada
(74) Attorney, Agent, or Firm—Dickstein, Shapiro, Morin & Oshinsky, LLP.

(57) ABSTRACT

A metal film is made by forming a first non-uniform continuous metal film made of an electroless plating catalyst material on a supporting member using a vacuum thin-film forming method, and then forming a second metal film by electroless plating using the first metal film as a catalyst.

16 Claims, 4 Drawing Sheets

METAL FILM AND MANUFACTURING METHOD THEREFOR, AND LAMINATED CERAMIC ELECTRONIC COMPONENT AND MANUFACTURING METHOD THEREFOR

The present invention relates to a metal film and a manufacturing method therefor, and to a laminated ceramic electronic component and a manufacturing method therefor. In particular, the present invention relates to a manufacturing method for a metal film which is formed basically by electroless plating and which is suitable for the use as an internal conductor film provided in a laminated ceramic electronic component.

A laminated ceramic electronic component, for example, a multilayer ceramic capacitor, is provided with an internal conductor film such as an internal electrode. The internal conductor film can be formed by various methods. Typical examples include forming the internal conductor film by the use of a thick-film forming technique, such as printing and baking of a conductive paste; or forming the internal conductor film by the use of a thin-film forming technique, such as a vacuum thin-film forming method, for example, vacuum evaporation or sputtering; or a wet plating method, for example, an electroless plating method or electroplating method. The method of forming the internal conductor film using the thin-film forming technique is particularly relevant to the present invention.

A manufacturing method for metal film using a thin-film forming technique is known, for example, from Japanese Unexamined Patent Application Publication No. 6-302469, which discloses a method in which a first metal film having a thickness of 0.1 to 0.3 $\mu$m is formed on an organic film (supporting member) by a vacuum thin-film forming method through a mask. A second metal film is formed on the first metal film by electroless plating and, therefore, a metal film having a predetermined thickness is manufactured.

The metal film thus formed on the organic film must be in a condition that the organic film can be peeled from the metal film by some step, for example, transfer from the organic film to a ceramic green sheet, in order to be used as the internal conductor film of the laminated ceramic electronic component.

However, the technique described in Japanese Unexamined Patent Application Publication No. 6-302469, suffers from the problems that where the metal film is formed under conditions that no defect occurs, there is peeling between the metal film and the supporting member and, furthermore, the transfer of the metal film to the ceramic green sheet are impossible. Also, the time for this transfer is increased, and part of the metal film is not transferred and remains on the supporting member and, therefore, breakage or cracking occurs in the metal film, and the like.

To tackle these problems, a method in which the adhesion between the supporting member and the metal film is reduced is effective. Consequently, measures have been taken in which, for example, some contrivances have been made in the combination of the material for the supporting member and the material for the first metal film. Some contrivances have also been made in the film making conditions regarding the thin-film forming method for forming the first metal film.

However, when adhesion between the supporting member and the metal film is reduced, peeling is likely to occur in the metal film due to an internal stress which occurs in the metal film during formation of the first metal film by the vacuum thin-film forming apparatus, or during electroless plating or water washing after the electroless plating for formation of the second metal film. Consequently, a problem is encountered in that defects, such as partial peeling and cracking, are likely to occur in the metal film.

To overcome this problem, a method is conceived in which one avoids occurrence of the defect due to peeling during the formation of the metal film and the adhesion to hold the metal film on the supporting member is ensured while the adhesion is reduced as low as possible to improve the mold-release property within the range of the adhesion. In order to realize this method, a method of precisely controlling the adhesion between the supporting member and the metal film has been suggested. For example, Japanese Unexamined Patent Application Publication No. 7-66072 discloses specifying the pin hole open area ratio of the first metal film to be between 1% to 70%. The metal film can be reliably held on a supporting member, while the force which is needed to peal the metal film from the supporting member is controlled.

However, inhibition of peeling which occurs during formation of the metal film by such a conventional technique degrades the mold-release property between the supporting member and the metal film. Consequently, the problem with the aforementioned Japanese Unexamined Patent Application Publication No. 6-302469, is that peeling between the supporting member and the metal film occurs and, furthermore, transfer to the ceramic green sheet has been impossible, the time for the transfer has been increased, and a part of the metal film has not been transferred and has remained on the supporting member and, therefore, breakage or cracking problems in the metal film have not yet been adequately overcome.

Japanese Unexamined Patent Application Publication No. 7-66072, describes a technique in which the first metal film is evaporated until the thickness is in the order of 0.1 $\mu$m. When evaporation is performed until such a thickness is achieved, the first metal film grows to a uniform continuous film in the thin film growth process described below. As is described in the aforementioned publication, even when a pin hole is formed, the size thereof is 1 $\mu$m in the example, and in general, 0.5 $\mu$m or more.

Although a uniform continuous films may be achieved over some regions of $10^5$ nm$^2$, only one or two boundary lines of pinholes may be observed in some regions having an area of $10^5$ nm$^2$, and other regions of $10^5$ nm$^2$ may become a part of the pin hole, and may become in a condition that no metal film exists within the area thereof.

Figure 5:
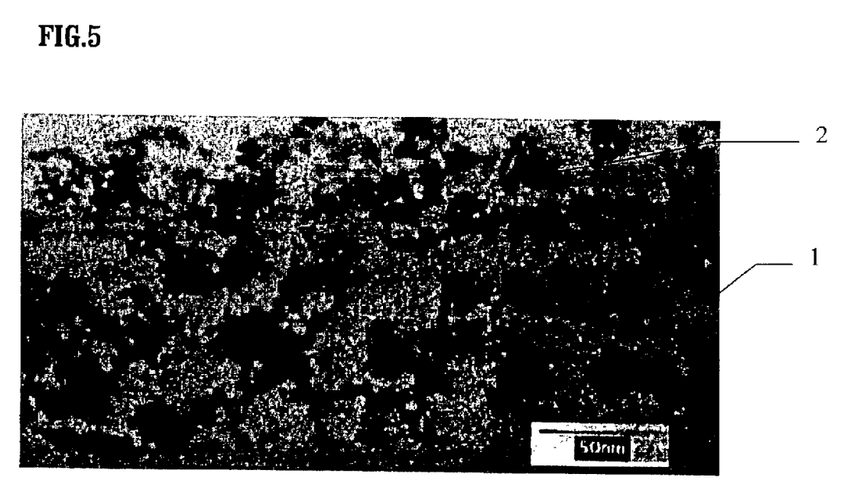
FIG. 5 is an electron micrograph of the first metal film according to Example 1 produced in Experiment 1.

Accordingly, as shown in FIG. 5, a condition in which the metal film is an island structure or a network structure over any region of $10^5$ nm$^2$ is not achieved in the conventional technique. That is, the control of peeling based on the technique described in Japanese Unexamined Patent Application Publication No. 7-66072 is a so-called macro control of peeling. A problem occurs regarding the combination of the metal used for the first metal film and the supporting member, and the film making condition in the thin-film forming method when the condition is that strong mold-release property can be exhibited is adopted. As cracking may occur in the metal film and the metal film may peel off due to internal stresses which occur in the portion other than the pin hole in the metal film during film making, or during plating or water washing after the plating, it is difficult to form a metal film including no defects, such as partial peeling and cracking.

There is a trade off between forming the metal film without defects, such as peeling, and achieving an excellent mold-release property between the supporting member and the metal film. Consequently, it has been difficult to stably produce a metal film satisfying both of these conditions.

SUMMARY OF THE INVENTION

Accordingly, it is an object of the present invention to provide a manufacturing method for a metal film which can overcome or reduce the aforementioned problems. The invention aims to satisfy both the requirement for an excellent mold-release property from the supporting member and the requirement that defects, for example, peeling and cracking, are unlikely to occur during film making by a vacuum thin-film forming apparatus or during metal film formation by plating or water washing after plating.

It is another object of the present invention to provide a laminated ceramic electronic component including the metal film manufactured by application of the aforementioned manufacturing method for the metal film, and to provide a manufacturing method for the laminated ceramic electronic component.

According to a first aspect of the invention, there is provided a manufacturing method for a metal film comprising: a first step of forming a first metal film made of an electroless plating catalyst material on a supporting member using a vacuum thin-film forming apparatus, said first step being completed before the first metal film grows to a uniform continuous film; and a second step of forming a second metal film by forming a film from a metal while electroless plating is applied using the first metal film as a catalyst.

The first metal film may be in an island structure (island stage), a network structure (channel stage or hole stage), in the shape of a cluster or in the shape of an atom or molecule. The metal film is preferably in an island structure or in a network structure in any region of $10^5$ nm$^2$, and more preferably, is in an island structure.

The first metal film preferably contains at least one metal selected from the group consisting of palladium, silver, gold, platinum, nickel, cobalt, rhodium and iridium. The first metal film is more preferably a metal film selected from the group consisting of a palladium film less than about 10 nm in thickness, a silver film less than about 20 nm in thickness, and a gold film less than about 20 nm in thickness.

The second metal film preferably contains at least one metal selected from the group consisting of nickel, copper, silver, palladium, platinum, cobalt and rhodium.

A second aspect of the invention provides a manufacturing method for a metal film comprising: a first step of forming a first metal film made of a electroless plating seed material on a supporting member using a vacuum thin-film forming apparatus, said first step being completed before the first metal film grows to a uniform continuous film; a second step of forming a second metal film made of an electroless plating catalyst material on at least the surface of the first metal film with ion displacement reaction by applying an immersion plating; and a third step of forming a third metal film by electroless plating using the second metal film as a catalyst.

The first metal film may be in any form as long as it is not a uniform continuous film, in a manner similar to that of the first aspect. However, the metal film is preferably in an island structure or a network structure in any region of $10^5$ nm$^2$, and more preferably, is in an island structure.

Preferably, the first metal film contains at least one metal selected from the group consisting of silver, aluminum, cadmium, cobalt, copper, chromium, iron, gallium, indium, manganese, nickel, lead, tin and zinc, and the second metal film contains at least one metal which is selected from the group consisting of palladium, platinum, gold, silver, rhodium and iridium and which is a metal capable of being substituted for the metal contained in the first metal film.

More preferably, the first metal film is a metal film selected from the group consisting of a copper film less than about 30 nm in thickness, a silver film less than about 20 nm in thickness, and an iron film less than about 10 nm in thickness.

Preferably, the third metal film contains at least one metal selected from the group consisting of nickel, copper, silver, palladium, platinum, cobalt, and rhodium.

In either the first or second aspect, preferably, the time for performing the first step is controlled in order to complete the first step before the first metal film grows to a uniform continuous film. A preparation step can be undertaken to find out the critical time for growth of the first metal film to a uniform continuous film by forming the first metal film under the same film making conditions as those in the first step except the time is varied and a time shorter than this critical time is chosen as the time for performing the first step.

Preferably, the first metal film is patterned by being formed through a mask in the first step.

Preferably, the surface of the supporting member, on which the first metal film is to be formed, has been subjected to a mold-release treatment.

Preferably, a film-shaped the supporting member is used.

Any material is used for the supporting member and, for example, an organic material, carbon, metal or metal oxide, can be used.

The present invention also provides a metal film produced by any one of the aforementioned manufacturing methods.

Preferably, this metal film is used to form an internal conductor film to be provided in a laminated ceramic electronic component.

The present invention also relates to a laminated ceramic electronic component provided with a plurality of laminated ceramic layers and an internal conductor film extending along a specified interface between the ceramic layers. In such a laminated ceramic electronic component embodying the present invention, the internal conductor film is brought about by the aforementioned metal film. A typical example of the aforementioned laminated ceramic electronic components include a multilayer ceramic capacitor.

The present invention also provides a metal film produced by the aforementioned manufacturing method and being formed on the supporting member. The manufacturing method for a laminated ceramic electronic component embodying the present invention can be performed as described below by applying the metal film onto the supporting member.

The invention further provides a manufacturing method for a laminated ceramic electronic component comprising forming a first metal film made of an electroless plating catalyst material on a supporting member using a vacuum thin-film forming apparatus, said forming being completed before the first metal film grows to a uniform continuous film; forming a second metal film by making a film from a metal while electroless plating is applied using the first metal film as a catalyst; producing a complex comprising the metal film and a ceramic green sheet by forming the ceramic green sheet on the supporting member to cover the metal film; producing a green laminate by laminating a plurality of the complexes; peeling the supporting member from each of the complexes; and baking the green laminate.

The invention still further provides a manufacturing method for a laminated ceramic electronic component comprising forming a first metal film made of an electroless plating catalyst material on a supporting member using a vacuum thin-film forming apparatus, the forming being completed before the first metal film grows to a uniform continuous film; forming a second metal film by making a film from a metal while electroless plating is applied using the first metal film as a catalyst; preparing a ceramic green sheet; producing a complex comprising the metal film and the ceramic green sheet by transferring the metal film from supporting member to the ceramic green sheet; producing a green laminate by laminating a plurality of the complexes; and baking the green laminate.

The present invention further provides a laminated ceramic electronic component produced by the aforementioned manufacturing method.

In embodiments of the manufacturing method for the metal film according to the present invention, the first metal film of electroless plating catalyst or seed material is formed so that it does not become a uniform continuous film, and subsequently, a second metal film is formed by electroless plating using the first metal film as a catalyst. Alternatively, the second metal film to become a catalyst for electroless plating is formed by an ionic displacement reaction for at least the surface of the first metal film and, thereafter, the third metal film is formed by electroless plating using the second metal film as a catalyst.

Because of this approach, even when the combination of a supporting member and metal film or film making conditions which give excellent mold-release properties for the supporting member from the metal film excellent are adopted, defects, for example, peeling and cracking in the metal film, can be made unlikely to occur during formation of the first metal film, or during electroless plating for forming the second or third metal film and during water washing thereafter.

In the manufacturing method for the metal film embodying the present invention, the first metal film electroless plating catalyst or seed material is formed so that it does not become a uniform continuous film. It was determined that when film making was performed until the first metal film grew to a uniform continuous film, the first metal film sometimes peeled off during subsequent electroless plating or water washing. However, when film making was completed before the first metal film grew to a uniform continuous film, the first metal film was unlikely to peel off during subsequent electroless plating or water washing. The present invention has been made based on this finding.

The reason for the occurrence of the phenomenon, from which the aforementioned finding was brought about, is assumed to be that when the first metal film is discontinuous, the internal stress of the plating coating, that is, the second or third metal film, during electroless plating is relaxed for some reason.

Consequently, when a laminated ceramic electronic component is produced using the metal film according to the present invention, excellent transfer of the metal film to the ceramic green sheet can be achieved reliably. The time required for the transfer can be reduced and, furthermore, the yield of the laminated ceramic electronic component can be improved.

In the manufacturing method for the metal film embodying the present invention, when the first metal film is made in an island structure or a network structure in any region of $10^5$ nm$^2$, even if the metal film is formed under the conditions that excellent mold-release property can be achieved, the effect of preventing occurrence of defects can be achieved with further reliability.

When a mask is used in formation of the first metal film, even if a step of, for example, photolithography and etching is not performed, a patterned metal film can be produced and, therefore, the step for producing a patterned metal film can be simplified.

The time for performing the step of forming the first metal film is controlled to complete before the first metal film grows to a uniform continuous film. In order to determine this time, a critical time for growth of the first metal film to a uniform continuous film is determined. When a time shorter than this critical time is chosen as the time for performing the step of forming the first metal film, discontinuity is achieved. Once this time has been determined, the first metal film can be formed stably without becoming a uniform continuous film in subsequent manufacture of the metal film.

BRIEF DESCRIPTION OF THE DRAWINGS

Embodiments of the invention will be described, by way of example, and with reference to the accompanying drawings, in which.

DESCRIPTION OF THE PREFERRED EMBODIMENTS

Figure 1A:
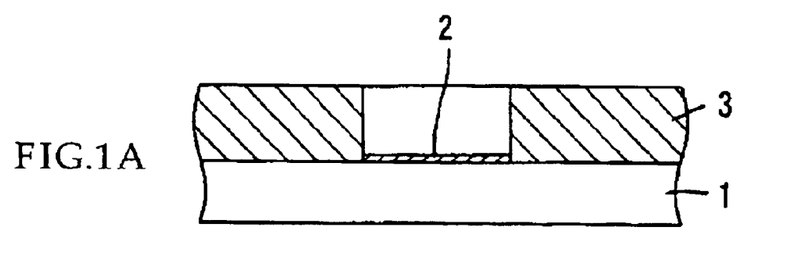
FIGS. 1A and 1B are sectional views for explaining an embodiment of a manufacturing method for a metal film embodying the present invention, showing typical steps included in this manufacturing method.
Figure 1B:
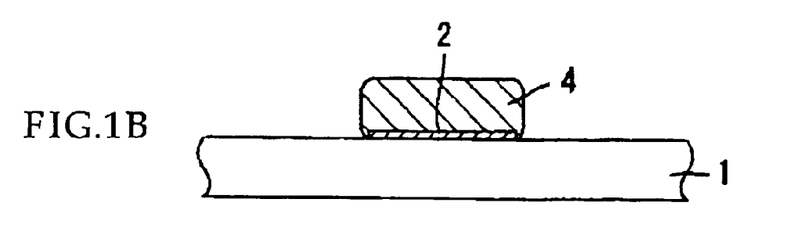
Figure 2:
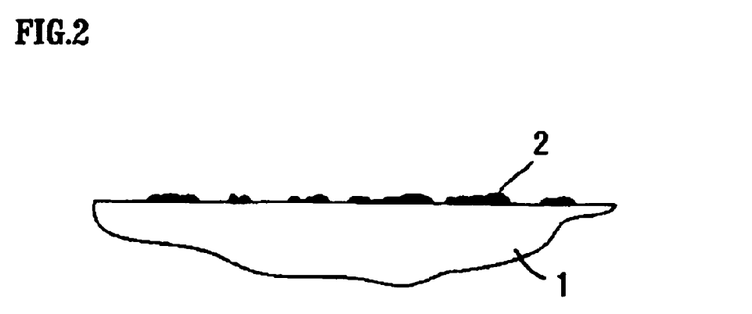
FIG. 2 is a sectional view illustrating the condition of formation of the first metal film 2 shown in FIG. 1A under further magnification.

FIGS. 1A and 1B and FIG. 2 explain a first embodiment of a manufacturing method for a metal film according to the present invention.

Regarding manufacture of a targeted metal film, a first step is performed as shown in FIG. 1A of forming a first metal film 2 made of a material to become a catalyst for electroless plating on a supporting member 1 by the use of a vacuum thin-film forming apparatus. Preferably, a mask 3 is used, and the first metal film 2 is patterned by forming the first metal film 2 through this mask 3.

Examples of the aforementioned vacuum thin-film forming apparatus include a vacuum evaporation apparatus, sputtering apparatus, laser ablation apparatus, ion plating apparatus, cluster ion beam apparatus and MBE apparatus.

An organic material, carbon, metal or metal oxide can be used as the material for the supporting member 1. Preferably, the supporting member 1 has a surface on which the first metal film 2 is to be formed which has been subjected to a mold-release treatment. When a material having low adhesion with respect to the first metal film 2 is used as the material for the supporting member 1, the mold-release treatment for the surface of the supporting member 1 can be omitted. For example, where an organic material such a fluororesin or silicone resin is used as the material for the supporting member 1, an excellent mold-release property is present even if the mold-release treatment is omitted.

The supporting member 1 may have the shape of a plate having relatively high rigidity or the shape of a film having pliability.

When the supporting member 1 is film-shaped, the configuration of the manufacturing apparatus can be simplified where the metal film is continuously produced as this can be wound into the shape of a roll and, in addition, high productivity can be expected. Furthermore, since storage space can be reduced if the metal film is mass-produced, and weight and volume can be reduced where the produced metal films are transported, and the storage cost and transportation cost can be reduced.

Where a film-shaped supporting member 1 is used, one made of polyethylene terephthalate, which is a carrier film used in molding of a ceramic green sheet, can be employed and the carrier film used in molding of a ceramic green sheet be diverted to the metal film production. In this case, desirably, the surface of the carrier film has been subjected to a mold-release treatment with a fluororesin or silicone resin in order to perform peeling with ease. As the material for the film-shaped supporting member 1, polypropylene, etc., in addition to polyethylene terephthalate can be used, and a film made of other than the organic film, such as stainless steel, etc., can also be used.

At least one metal selected from the group consisting of palladium, silver, gold, platinum, nickel, cobalt, rhodium and iridium may be used as the material constituting the first metal film 2 to become a catalyst for electroless plating. These metals may be used alone or in an alloy containing these metals.

In order to achieve excellent catalysis, it is necessary to prevent passivation due to formation of an oxide layer. Consequently, after the first metal film 2 is formed, it is necessary to promptly perform electroless plating described below, or to prevent formation of the oxide layer. It is preferable to use noble metals from the viewpoint of performing control with ease. Most of all, palladium is desirable because of high catalysis with respect to various plating solutions. It is also effective to perform electroless plating as described below after a treatment to remove the passive layer.

In embodiments of the present invention, it is important to complete the first step of forming the first metal film before the first metal film 2 grows to a uniform continuous film.

The first metal film 2 formed by the first step may be in any form as long as it is not a uniform continuous film, as shown in FIG. 2. For example, the first metal film may be an island strrucute (island stage), a network structure (channel stage or hole stage), the shape of an atom, the shape of a molecule, the shape of a cluster or the like. In particular, the first metal film 2 is preferably does not exist as a uniform continuous film in any region of $1 \times 10^5$ nm$^2$. The form of the first metal film 2 is preferably an island structure or a network structure, more preferably, is an island structure or the shape of a network structure in channel stage, and most preferably, is an island structure.

In the growth process of thin film, the arrival of an atom at the supporting member, migration, formation of a seed, growth of the seed and coalescence generally occur in that order. Growth to a uniform continuous film occurs through the intermediate stages of an island structure and the a network structure. The time required for growth to the uniform continuous film varies depending on the film making conditions, for example, the sorts and conditions of material to be adhered and the supporting member, and also the conditions set in a vacuum thin-film forming apparatus. However, in general, when the thickness reaches in the order of several tens of nanometers at the maximum, growth to the uniform continuous film occurs. The present inventor's experiences show that when thicknesses become about 10 nm or more, about 20 nm or more, about 30 nm or more, about 20 nm or more, and about 10 nm or more with respect to palladium, silver, copper, gold and iron, respectively, evaporated films grow to uniform continuous films regarding almost every supporting member and evaporation conditions.

Therefore, when the manufacturing method for the metal film embodying the present invention is performed, a preparation step in which the film making condition is determined is preferably performed in advance. This may include for example, the type of the material constituting the first metal film 2 and the supporting member 1, and the conditions set in the vacuum thin-film forming apparatus, except the condition with respect to time. Under this determined film making condition, the first metal film 2 is formed and, therefore, the critical time for growth of the first metal film 2 to the uniform continuous film is determined.

In a practical mass-production stage, the first step for forming the first metal film 2 is performed with a time shorter than the critical time determined in the aforementioned preparation step. Where the film is continuously made on long lengths of a film supporting member, the aforementioned time can be controlled by the transport speed of the film. However, as a matter of course, the first metal film 2 must be formed with an adequate adhesion quantity to function as catalyst seeds for electroless plating in the later step of electroless plating.

As shown in FIG. 1B, the second step of forming the second metal film 4 is performed by making a film from a specified metal while electroless plating is applied using the first metal film 2 as a catalyst.

In the electroless plating for forming the second metal film 4, an electroless plating bath is used. This may comprise of, for example, at least one metal selected from the group consisting of nickel, copper, silver, palladium, platinum, cobalt and rhodium.

This second metal film 4 constitutes the key portion of the resulting metal film. The second metal film 4 is desirably composed of copper or nickel from the viewpoint of electrical conductivity, cost, etc. where this metal film is used as an internal conductor film of a laminated ceramic electronic component and where it is possible to apply a reducing atmosphere when baking to produce the laminated ceramic electronic component. In this case, for example, an electroless copper plating bath, an electroless nickel-phosphorus alloy plating bath and an electroless nickel-boron alloy plating bath, can be used as the electroless plating bath.

On the other hand, if it is not possible to apply a reducing atmosphere at baking stage to produce the laminated ceramic electronic component, the second metal film 4 is composed of silver, palladium, platinum or an alloy thereof.

Alloys made by mixing the aforementioned various metals with other metal elements as eutectoid may be used. In addition to these, electroless plating baths of cobalt-phosphorus, cobalt-boron, rhodium, etc., can be used.

As shown in FIG. 1A, a mask 3 is used to form the first metal film 2, and the first metal film 2 is thereby patterned. Consequently, when electroless plating is performed in the second step, the second metal film 4 is formed only on the portion on which the first metal film 2 has been formed and, therefore, the metal film can be patterned as a whole. As such a mask 3, for example, metal masks and various mask films can be used.

The method for patterning is not limited to the aforementioned method using the mask 3. Methods using various resists, for example, a photoresist, are possible. A method in which etching is performed after the first metal film 2 is formed, and a method in which etching is performed after the second metal film 4 is formed, are also possible.

However, from the viewpoint of simplification of the process, a method using the mask 3, such as a metal mask, is advantageous as the mask 3 can be attached or detached with ease, can be used repeatedly and a patterning condition has been achieved at the stage in which the first metal film 2 has been formed.

The manufacturing method for the metal film embodying the present invention can also be performed as described below.

In this second embodiment, the first step of forming the first metal film on the supporting member uses a vacuum thin-film forming apparatus. A material is used as the material for forming the first metal film which becomes a seed for the electroless plating, but which may not exhibit catalysis with respect to the electroless plating.

This first step is completed before the first metal film grows to a uniform continuous film. This is similar to the first embodiment. The first metal film is preferably in an island structure or a network structure in any region of $1 \times 10^5$ nm$^2$. This is also similar to the first embodiment.

Subsequently, a material which will act as an electroless plating catalyst is substituted for the surface or the whole of the first metal film to become a seed for electroless plating by immersion plating and, thereby, the second step of forming a second metal film is performed. This second metal film is formed due to an ionic displacement reaction for at least the surface of the first metal film as described above. Therefore, in a manner similar to that of the first metal film, a uniform continuous film is not realized.

More specifically, the supporting member on which the first metal film has been formed is immersed in a solution of a metal having catalysis with respect to the electroless plating solution in this second step. A ionic displacement reaction proceeds due to the difference in oxidation-reduction equilibrium potential in this immersed condition and the second metal film is formed. Consequently, it is necessary that the oxidation-reduction equilibrium potential of the metal constituting the first metal film is more base than that of the metal constituting the second metal film. Conversely, it is necessary that the oxidation-reduction equilibrium potential of the metal constituting the second metal film is more noble than that of the metal constituting the first metal film.

As described above, the first metal film does not necessarily have catalysis with respect to the electroless plating solution. It can be composed of, for example, at least one metal selected from the group consisting of silver, aluminum, cadmium, cobalt, copper, chromium, iron, gallium, indium, manganese, nickel, lead, tin and zinc. Of these metals, cadmium, lead, tin and zinc function as catalyst poisons and, therefore, when a glossy film is required, it is better to use a different metal.

On the other hand, a palladium chloride hydrochloric acid aqueous solution and the like can be used as a solution of a metal having catalysis used for forming the second metal film. This solution is generally used as an activation solution for pretreatment of electroless plating. As a matter of course, among other metals having catalysis, those having an oxidation-reduction equilibrium potential nobler than that of the material constituting the first metal film can be used, that is, those capable of substituting for the metal contained in the first metal film. For example, platinum, gold, silver, rhodium and iridium, as well as palladium can be used.

The metals exemplified as contained in the first or second metal films may be used alone or as an alloy containing any one of these metals.

The third step of forming a third metal film is performed by making a metal film while electroless plating is applied using the aforementioned second metal film as a catalyst. Since this third step corresponds to the second step of forming second metal film 4 in the aforementioned first embodiment and is substantially similar to this, the aforementioned explanation is also applied thereto.

As described above, the metal film produced in the first or second embodiment can be used advantageously in forming an internal conductor film of a laminated ceramic electronic component, for example, an internal electrode for forming capacitance of a multilayer ceramic capacitor.

Figure 3A:
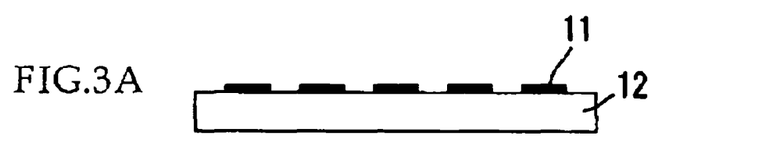
FIGS. 3A to 3C are sectional views explaining a first embodiment of a manufacturing method for a laminated ceramic electronic component according to the present invention, and showing typical steps included in this manufacturing method.
Figure 3B:
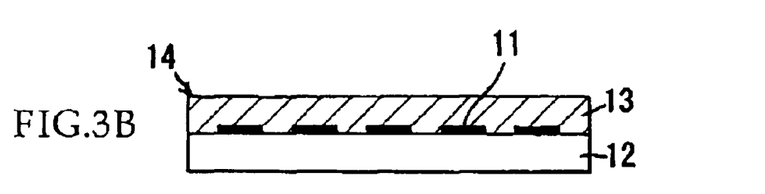
Figure 3C:
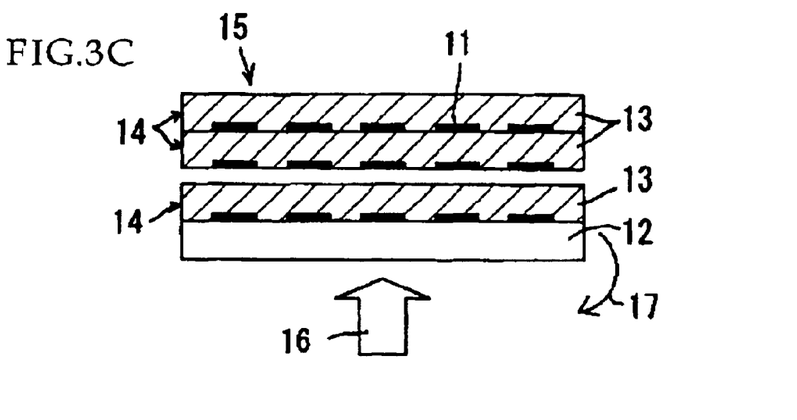

FIGS. 3A to 3C show a first embodiment of a manufacturing method for a laminated ceramic electronic component according to the present invention.

In FIG. 3A, the metal films 11 produced by the first or second embodiments of the manufacturing method for the metal film according to the present invention are shown being formed on the supporting member 12. The metal films 11 are handled in the condition of being formed on the supporting member 12 as shown in FIG. 3A.

As shown in FIG. 3B, a complex 14 composed of the metal films 11 and a ceramic green sheet 13 is produced by molding the ceramic green sheet 13 on the supporting member 12 in order to cover the metal films 11.

As shown in FIG. 3C, a green laminate 15 is produced by laminating a plurality of complexes 14. As FIG. 3C shows an intermediate stage during lamination of the complexes 14, only a part of the green laminate is shown in the drawing. FIG. 3C shows that precedence in lamination is given to a complex 14 located at an upper position.

As shown in FIG. 3C, one complex 14 is backed by the supporting member 12 until it is laminated on a complex 14 which has been laminated precedingly. Consequently, every time a complex 14 is laminated, a plurality of complexes 14 are repeatedly pressure-bonded by application of pressure from the supporting member 12 side as indicated by arrow 16. Thereafter, the supporting member 12 is peeled off as indicated by arrow 17.

The step of peeling the supporting member 12 may be performed before the step of laminating each complex 14.

When the green laminate 15 is for production of a monolithic ceramic capacitor, alignment among the metal films 11 is performed in order that an internal electrode for forming capacitance is configured by the metal films 11 facing each other with the ceramic green sheet 13 therebetween in the step of lamination.

The green laminate 15 is cut in order to produce a laminate chip for an individual laminated ceramic electronic component. If necessary, it is thereafter subjected to a step of degreasing and to a step of baking.

Subsequently, terminal electrodes, etc., are formed on the outer surface of the baked laminate and, therefore, a targeted laminated ceramic electronic component, such as a monolithic ceramic capacitor, is completed.

Figure 4A:
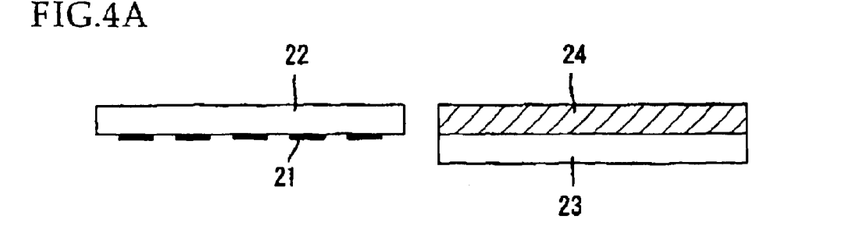
FIGS. 4A to 4C are sectional views explaining a second embodiment of the manufacturing method for a laminated ceramic electronic component according to the present invention, and showing typical steps included in this manufacturing method.
Figure 4B:
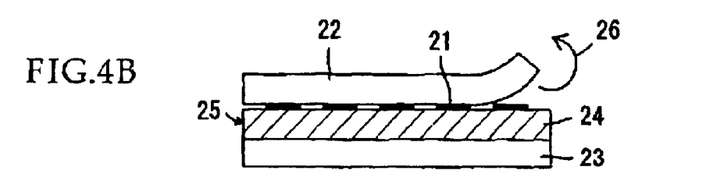
Figure 4C:
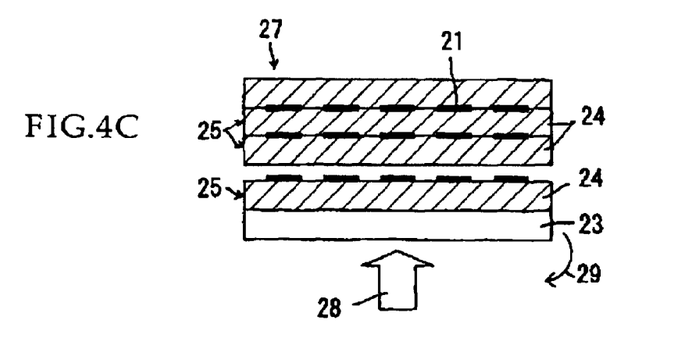

FIGS. 4A to 4C are diagrams for explaining a second embodiment of the manufacturing method for the laminated ceramic electronic component according to the present invention.

In FIG. 4A, the metal films 21 are shown being formed on the supporting member 22 in a manner similar to that shown in FIG. 3A. In FIG. 4A, a ceramic green sheet 24 molded on a carrier film 23 is also shown. The metal films 21 formed on the supporting member 22 and the ceramic green sheet 24 molded on the carrier film 23 are prepared, respectively, and, thereafter, the following steps are performed sequentially.

As shown in FIG. 4B, a step of forming a complex 25 of the metal films 21 and the ceramic green sheet 24 is performed by transferring the metal films 21 from the supporting member 22 to the ceramic green sheet 24.

Specifically, the metal films 21 formed on the supporting member 22 and the ceramic green sheet 24 backed by the carrier film 23 are overlapped with each other, and in that condition, the supporting member 22 and the carrier film 23 are pressed in the direction of overlapping. Subsequently, the supporting member 22 is peeled off as indicated by arrow 26 and, thereby, the metal films 21 are transferred from the supporting member 22 to the ceramic green sheet 24.

As shown in FIG. 4C, a step of forming a green laminate 27 is performed by laminating a plurality of complexes 25. In FIG. 4C, similarly to FIG. 3C, only a part of the green laminate 27 is shown in the drawing, and the drawing shows that precedence in lamination is given to a complex 25 located at an upper position.

The complex 25 is backed by the carrier film 23 until it is laminated on the preceedingly laminated complex 25. Consequently, after the complex 25 is laminated, pressure is applied from the carrier film 23 side as indicated by an arrow 28, the complexes 25 are repeatedly pressure-bonded with each other and, thereafter, the carrier film 23 is peeled off as indicated by arrow 29, so that the green laminate 27 is produced.

The step of peeling the carrier film 23 may be performed before the step of laminating each complex 25.

In a manner similar to that in the aforementioned first embodiment, the green laminate 27 thus produced is cut, and if necessary, subjected to a step of degreasing and baking. Subsequently, terminal electrodes, etc., are formed and, therefore, a targeted laminated ceramic electronic component, such as a multilayer ceramic capacitor, is produced.

Embodiments of the present invention can be applied to laminated ceramic electronic components, for example, multilayer ceramic supporting members, laminated ceramic inductors, and laminated filters, as well as multilayer ceramic capacitors.

Next, experiments which were performed in order to verify the effects according to embodiments of the present invention will be described.

Experiment 1

In Experiment 1, examples and comparative examples regarding the manufacturing method for the metal film were performed, respectively, and evaluations thereof were made.

1. EXAMPLE 1

(1) A film made of polyethylene terephthalate on which a silicone-based mold-release layer had been formed was prepared as a supporting member. A metal mask made of stainless steel 0.2 mm in thickness on which openings had been placed at the portions that would become a plurality of internal electrodes for a multilayer ceramic capacitor was prepared.

(2) The aforementioned metal mask was closely adhered to the surface of the supporting member on which the mold-release layer had been formed. A first metal film was formed by evaporating palladium on the openings of the metal mask at a film making rate of 1 Å/sec on a quartz resonator thickness gauge basis for 10 seconds by a vacuum evaporation apparatus through this metal mask.

The first metal film formed from palladium was observed with an electron microscope (TEM), and it was verified that palladium existed in an island structure in any region of $1 \times 10^5$ nm$^2$.

(3) The supporting member on which the first metal film had been formed was immersed in an electroless nickel-phosphorous alloy plating bath using phosphinic acid as a reducing agent to form a second metal film. In this electroless plating, the bath temperature was 80° C. and the immersion time was 50 seconds. The film thickness of thus formed metal film was 0.7 μm. This metal film had no defects and had excellent mold-release properties.

2. EXAMPLE 2

(1) A supporting member and a metal mask similar to those in (1) of Example 1 were prepared.

(2) The aforementioned metal mask was closely adhered to the surface on the mold-release layer side of the aforementioned supporting member. A first metal film was formed by evaporating iron on the openings of the metal mask at a film making rate of 2 Å/sec on a quartz resonator thickness gauge basis for 10 seconds by a vacuum evaporation apparatus through this metal mask.

The first metal film formed from iron was observed with an electron microscope (TEM) and it was verified that iron existed in an island structure in any region of $1 \times 10^5$ nm$^2$.

FIG. 5 is an electron micrograph of the aforementioned first metal film. In FIG. 5, reference numeral 1 denoted the supporting member, and reference numeral denoted the first metal film.

(3) Palladium was substituted for the surface of the first metal film made of iron by immersing the supporting member on which the first metal film had been formed in a palladium chloride-hydrochloric acid aqueous solution for one minute, and thereby, the second metal film made of palladium was formed.

(4) The supporting member on which the second metal film had been formed was immersed in an electroless nickel-phosphorous alloy plating bath similar to that in the step (3) of Example 1 for a similar immersion time and, therefore, a third metal film was formed by electroless plating. The film thickness of thus formed metal film was 0.7 μm. This metal film had no defects and had excellent mold-release properties.

3. EXAMPLE 3

(1) A supporting member and a metal mask similar to those in (1) of Example 1 were prepared.

(2) The aforementioned metal mask was closely adhered to the surface on the mold-release layer side of the aforementioned supporting member. A first film was formed by evaporating silver on the openings of the metal mask at a film making rate of 6 Å/sec on a quartz resonator thickness gauge basis for 16 seconds by a vacuum evaporation apparatus through this metal mask.

The first metal film formed from silver was observed with an electron microscope (TEM), and it was verified that the first metal film existed in an island structure in any region of $1 \times 10^5$ nm$^2$.

(3) The supporting member on which the first metal film had been formed was immersed in an electroless nickel-phosphorous alloy plating bath similar to that in the step (3) of Example 1 for a similar immersion time and, therefore, a second metal film was formed by electroless plating. The film thickness of thus formed metal film was 0.6 μm. This metal film had no defects and had excellent mold-release properties.

4. EXAMPLE 4

(1) A supporting member and a metal mask similar to those in (1) of Example 1 were prepared.

(2) The aforementioned metal mask was closely adhered to the surface on the mold-release layer side of the aforementioned supporting member. A first metal film was formed by evaporating silver on the openings of the metal mask at a film making rate of 5 Å/sec on a quartz resonator thickness gauge basis for 10 seconds by a vacuum evaporation apparatus through this metal mask.

The first metal film formed from silver was observed with an electron microscope (TEM), and it was verified that the first metal film existed in an island structure in any region of $1 \times 10^5$ nm$^2$.

(3) Palladium was substituted for the surface of the first metal film made of silver by immersing the supporting member, on which the first metal film had been formed in a palladium chloride.hydrochloric acid aqueous solution for one minute, and thereby, the second metal film made of palladium was formed.

(4) The supporting member, on which the second metal film had been formed, was immersed in an electroless nickel-phosphorous alloy plating bath similar to that in the step (3) of Example 1 for a similar immersion time and, therefore, a third metal film was formed by electroless plating. The film thickness of thus formed metal film was 0.7 μm. This metal film had no defects and had excellent mold-release properties.

5. EXAMPLE 5

(1) A supporting member and a metal mask similar to those in (1) of Example 1 were prepared.

(2) The aforementioned metal mask was closely adhered to the surface on the mold-release layer side of the aforementioned supporting member. A first metal film was formed by evaporating copper on the openings of the metal mask at a film making rate of 4 Å/sec on a quartz resonator thickness gauge basis for 30 seconds by a vacuum evaporation apparatus through this metal mask.

The first metal film formed from copper was observed with an electron microscope (TEM), and it was verified that the first metal film existed in an island structure in any region of $1 \times 10^5$ nm$^2$.

(3) Palladium was substituted for the surface of the first metal film made of copper by immersing the supporting member on which the first metal film had been formed in a palladium chloride.hydrochloric acid aqueous solution for one minute, and thereby, the second metal film made of palladium was formed.

(4) The supporting member on which the second metal film had been formed, was immersed in an electroless nickel-phosphorous alloy plating bath similar to that in the step (3) of Example 1 for a similar immersion time and, therefore, a third metal film was formed by electroless plating. The film thickness of thus formed metal film was 0.7 μm. This metal film had no defects and had excellent mold-release properties.

6. COMPARATIVE EXAMPLE 1

(1) A supporting member and a metal mask similar to those in (1) of Example 1 were prepared.

(2) The aforementioned metal mask was closely adhered to the surface on the mold-release layer side of the aforementioned supporting member. A first metal film was formed by evaporating palladium on the openings of the metal mask at a film making rate of 1 Å/sec on a quartz resonator thickness gauge basis for 100 seconds by a vacuum evaporation apparatus through this metal mask.

The first metal film formed from palladium was observed with an electron microscope (TEM), and it was verified that the first metal film was a uniform continuous film in any region of $1 \times 10^5$ nm$^2$.

(3) Immersion in an electroless nickel-phosphorous alloy plating bath similar to that in the step (3) of Example 1 for a similar immersion time was performed and, therefore, an operation for forming a second metal film by electroless plating was performed.

However, the second metal film peeled off together with the first metal film during this electroless plating and during water washing after the plating and, therefore, a metal film could not be formed excellently.

7. COMPARATIVE EXAMPLE 2

(1) A supporting member and a metal mask similar to those in (1) of Example 1 were prepared.

(2) The aforementioned metal mask was closely adhered to the surface on the mold-release layer side of the aforementioned supporting member. A first metal film was formed by evaporating nickel on the openings of the metal mask at a film making rate of 10 Å/sec on a quartz resonator thickness gauge basis for 100 seconds by a vacuum evaporation apparatus through this metal mask.

The first metal film formed from nickel was observed with a scanning electron microscope (SEM), and it was verified that the first metal film was a uniform continuous film in any region of $1 \times 10^5$ nm$^2$.

(3) The supporting member on which the first metal film had been formed was immersed in an electroless nickel-phosphorous alloy plating bath similar to that in the step (3) of Example 1 for a similar immersion time and, therefore, a second metal film was formed by electroless plating. The film thickness of thus formed metal film was 0.8 μm. This metal film had a poor mold-release property and was not transferred when transfer to a ceramic green sheet was attempted.

Experiment 2

In this Experiment, a multilayer ceramic capacitor was produced using the metal film according to Example 1 of Experiment 1 as an internal electrode.

A ceramic green sheet 7 μm in thickness containing barium titanate as a primary material was formed by the doctor blade method on a supporting member on which a metal film had been formed.

A green laminate provided with a plurality of metal films and a plurality of ceramic green sheets was produced by repeatedly press bonding a plurality of complexes each composed of the ceramic green sheet and the metal film laminated together. Press-bonded of the complexes with each other was performed by pressuring from the supporting member side.

The peeling property of the metal film from the supporting member was excellent during this step.

The green laminate was cut into a predetermined size and, thereafter, was baked at a temperature of 1200° C.

Subsequently, a terminal electrode was formed and, therefore, a multilayer ceramic capacitor was produced.

Various modifications to the embodiment described are possible and will occur to the those skilled in the art without departing from the scope of the invention which is defined by the following claims.

What is claimed is:

1. A manufacturing method for a metal film comprising:
   forming a first metal film made of an electroless plating catalyst material on a supporting member using a vacuum thin-film forming method, said forming being completed before the first metal film grows to a uniform continuous film; and
   forming a second metal film by forming a film from a metal while electroless plating is applied using the first metal film as a catalyst.

2. The manufacturing method for the metal film according to claim 1, wherein in the first step, the first metal film is in an island structure or in a network structure in any region of $1 \times 10^5$ nm$^2$.

3. The manufacturing method for the metal film according to claim 1, wherein the first metal film comprises at least one metal selected from the group consisting of palladium, silver, gold, platinum, nickel, cobalt, rhodium and iridium.

4. The manufacturing method for the metal film according to claim 1, wherein the first metal film comprises a metal film selected from the group consisting of a palladium film less than 10 nm in thickness, a silver film less than 20 nm in thickness, and a gold film less than 20 nm in thickness.

5. The manufacturing method for the metal film according to claim 1, wherein the metal film formed while electroless plating is applied comprises at least one metal selected from the group consisting of nickel, copper, silver, palladium, platinum, cobalt and rhodium.

6. The manufacturing method for a metal film according to claim 1, further comprising:
   producing a complex comprising the second metal film and a ceramic green sheet by forming the ceramic green sheet on the supporting member to cover the second metal film;
   producing a green laminate by laminating a plurality of the complexes;
   separating the supporting member from each of the complexes; and
   baking the green laminate, whereby a laminated ceramic electronic component is realized.

7. The manufacturing method for a metal film according to claim 1, further comprising:
   providing a ceramic green sheet;
   producing a complex comprising the second metal film and the ceramic green sheet by transferring the second metal film from supporting member to the ceramic green sheet;
   producing a green laminate by laminating a plurality of the complexes; and
   baking the green laminate, whereby a laminated ceramic electronic component is realized.

8. A manufacturing method for a metal film comprising:
   forming a first metal film made of a electroless plating seed material on a supporting member using a vacuum thin-film forming method, said forming being completed before the first metal film grows to a uniform continuous film;
   forming a second metal film made of an electroless plating catalyst material on at least the surface of the first metal film with ion displacement reaction by applying an immersion plating; and
   forming a third metal film by electroless plating the second metal film as a catalyst.

9. The manufacturing method for a metal film according to claim 8, wherein in the first step, the first metal film is in an island structure or in a network structure in any region of $1 \times 10^5$ nm$^2$.

10. The manufacturing method for a metal film according to claim 8, wherein the metal film formed while electroless plating is applied comprises at least one metal selected from the group consisting of nickel, copper, silver, palladium, platinum, cobalt and rhodium.

11. The manufacturing method far a metal film according to claim 8, wherein the first metal film comprises at least one metal selected from the group consisting of silver, aluminum, cadmium, cobalt, copper, chromium, iron, gallium, indium, manganese, nickel, lead, tin, and zinc, and the second metal film comprises at least one metal which is selected from the group consisting of palladium, platinum, gold, silver, rhodium, and iridium and which is a metal capable of being substituted for the metal contained in the first metal film.

12. The manufacturing method for a metal film according to claim 8, wherein the first metal film comprises a metal film selected from the group consisting of a copper film less than 30 nm in thickness, a silver film less than 20 urn in thickness, and an iron film less than 10 nm in thickness.

13. The manufacturing method for a metal film according to claim 8, further comprising:
   producing a complex comprising the third metal film and a ceramic green sheet by forming the ceramic green sheet on the supporting member to cover the third metal film;
   producing a green laminate by laminating a plurality of the complexes;
   separating the supporting member from each of the complexes; and
   baking the green laminate, whereby a laminated ceramic electronic component is realized.

14. The manufacturing method for a metal film according to claim 8, further comprising:
   providing a ceramic green sheet;
   producing a complex comprising the third metal film and the ceramic green sheet by transferring the third metal film from supporting member to the ceramic green sheet;
   producing a green laminate by laminating a plurality of the complexes; and
   baking the green laminate, whereby a laminated ceramic electronic component is realized.

15. The manufacturing method according to claim 8, wherein the third metal film is separated from the supporting member.

16. The manufacturing method according to claim 1, wherein the second metal film is separated from the supporting member.

* * * * *